United States Patent [19]

Hastings et al.

[11] Patent Number: 5,277,615
[45] Date of Patent: Jan. 11, 1994

[54] APPARATUS FOR REMOVABLY SUPPORTING A PLURALITY OF HOT PLUG-CONNECTED HARD DISK DRIVES

[75] Inventors: Robert J. Hastings, Houston; Paily T. Varghese, Tomball, both of Tex.

[73] Assignee: Compaq Computer Corporation, Houston, Tex.

[21] Appl. No.: 950,598

[22] Filed: Sep. 24, 1992

[51] Int. Cl.$^5$ ............ H01R 13/642; H05K 5/00; H05K 7/16
[52] U.S. Cl. .................. 439/377; 439/64; 361/391
[58] Field of Search ............ 439/59, 61, 62, 64, 439/377, 327, 328, 325; 361/391, 393, 394; 29/453; 211/26; 403/323, 380

[56] References Cited

U.S. PATENT DOCUMENTS

| | | | |
|---|---|---|---|
| 4,550,362 | 10/1985 | Reymer | 439/377 |
| 4,742,608 | 5/1988 | M'Sadoques et al. | 29/453 X |
| 4,896,777 | 1/1990 | Lewis | 211/26 X |
| 4,941,841 | 7/1990 | Darden et al. | 439/377 X |
| 4,979,909 | 12/1990 | Andrews | 211/26 X |
| 5,003,431 | 3/1991 | Imsdahl | 439/64 X |
| 5,187,643 | 2/1993 | I-Shou | 361/380 |

Primary Examiner—Mark Rosenbaum
Assistant Examiner—Khan V. Nguyen
Attorney, Agent, or Firm—Konneker, Bush & Hitt

[57] ABSTRACT

A series of hard disk drives are secured atop molded plastic support trays slidably and removably received in opposing guide channel member pairs snap-fitted into opposite side walls of a sheet metal cage structure externally used in conjunction with a file server or other computer device. Snap-fitted into rear end portions of the trays are small printed circuit boards that are insertable into hot plug sockets at the rear of the cage. Forwardly projecting guard plates on the rear end of the cage block manual access to the board/socket interface, and the surface mounted grounding leads on the board extend rearwardly beyond its signal leads to enhance grounding safety during disk drive installation and removal. At the front end of each tray is a vertical support plate upon which LED indicating lights are conveniently mounted for the associated disk drive. Each guide channel member has a metal grounding clip portion that is pressed against the adjacent cage wall and is contacted by a grounding screw on the disk drive as the drive is slid into the housing, the grounding screw also functioning to prevent inadvertent upside-down installation of the drive. To assist in installing and removing each disk drive, its associated support tray is provided at its front corners with pivotable ejection latch members removably secured thereto using a molded connection structure that eliminates the requirement for attachment screws or rivets.

22 Claims, 5 Drawing Sheets

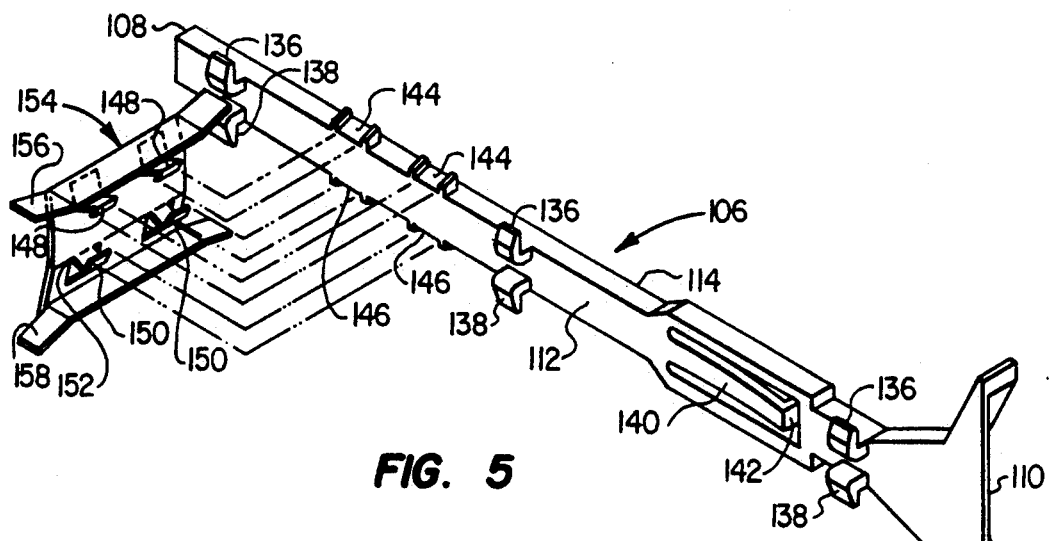
FIG. 5
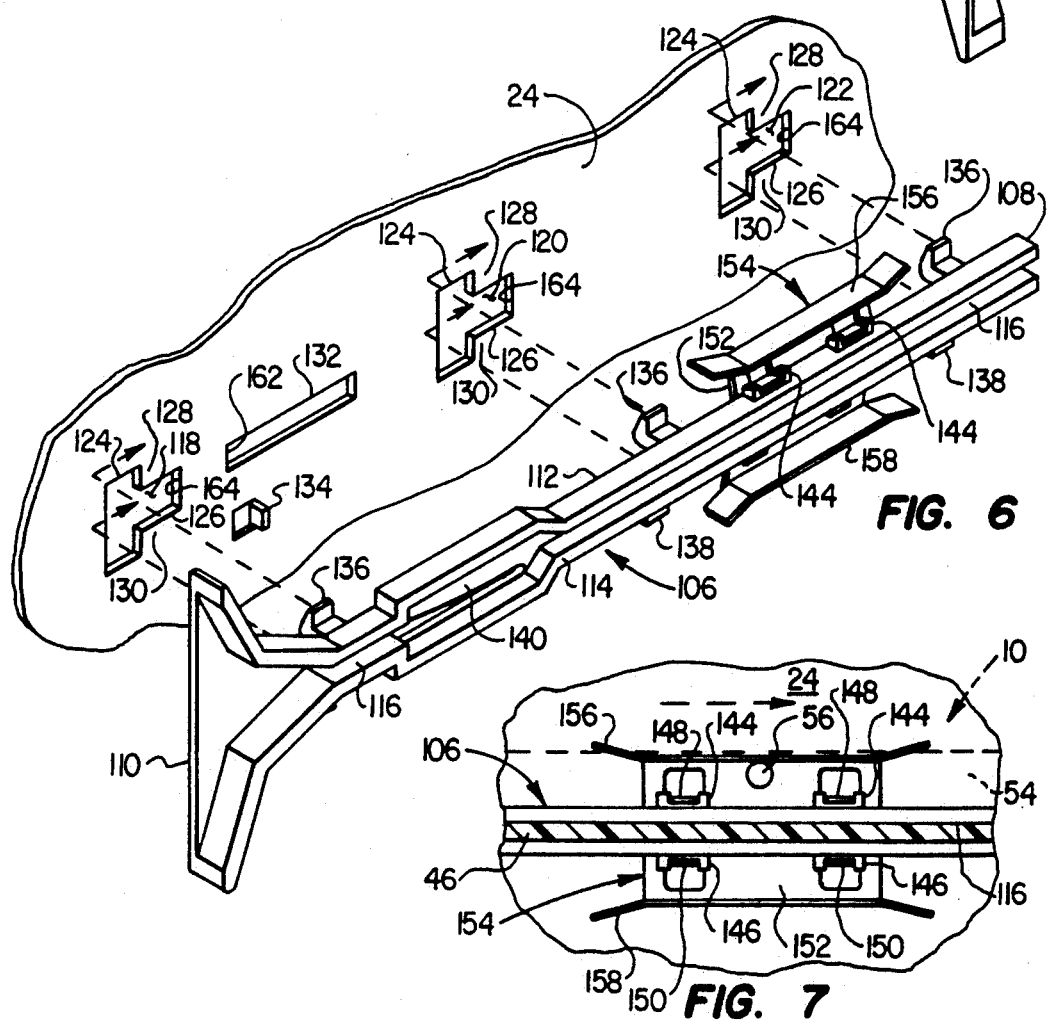
FIG. 6
FIG. 7

APPARATUS FOR REMOVABLY SUPPORTING A PLURALITY OF HOT PLUG-CONNECTED HARD DISK DRIVES

BACKGROUND OF THE INVENTION

1. Field of the Invention

The present invention relates generally to the mounting and support of hard disk drives for computers, and more particularly relates to apparatus for removably supporting a plurality of hot plug-connected hard disk drives.

2. Description of Related Art

Hard disk drives for a file server or other computer are often mounted, in a vertically spaced array external to the file server, in a rectangular sheet metal "cage" structure within an external disk drive support housing. For operational convenience and flexibility, each disk drive is typically "hot plug" connected within the support housing. This type of electrical connection permits any of the supported disk drives to be removed and re-installed within the support housing without disturbing the operation of the other disk drives.

Under a conventional practice, each disk drive is mounted atop a printed circuit board having a rear card edge portion which is insertable into a back plane hot plug socket within the cage structure. To install each disk drive within the cage, side edge portions of its supporting printed circuit board are inserted into a pair of track members mounted on opposed side wall portions of the cage and then slid rearwardly along the tracks until the rear card edge portion of the circuit board is operatively received its associated hot plug socket at the back of the cage.

Some or all of the following problems, limitations and disadvantages are commonly associated with conventional hot plug disk drive support apparatus of this general type:

1. The use of a printed circuit board to underlie and carry each hard disk drive tends to increase both the complexity and cost associated with removably supporting each disk drive, and additionally presents sharp solder and wire points along the underside of the board which the installer must carefully handle to avoid scratches and nicks in his fingers when installing and removing the disk drive from the cage.

2. On some circuit board-supported disk drives, a considerable amount of manual pulling force is required to disconnect the board from its associated hot plug socket within the cage. On other conventionally supported disk drives, the circuit board is provided with pivotable ejection latches that must be screwed or pinned to the circuit board, thereby increasing the overall complexity and fabricational cost of the support system.

3. A typical method of securing an installed disk drive within the cage is to install a screw in the cage which acts as a stop to prevent removal of the disk drive assembly from the cage. This undesirably complicates and lengthens the individual disk drive installation and removal procedure.

4. Among other grounding-related problems, the necessary grounding between each disk drive and the sheet metal cage in which it is removably supported often requires fairly complex interconnections therebetween which tend to be rather tedious and time consuming to properly utilize. Additionally, the card edge hot plug socket interface area is normally exposed within the cage where it can be inadvertently touched by an installer trying to make alignment or other adjustments within the cage.

5. It is conventional to provide each disk drive with a plurality of indicating lights showing the operative state of the drive. However, under conventional practice, these indicating light arrays typically must be located on the support housing remote from the disk drives. This can lead to visual confusion as to which indicating lights are associated with which disk drive.

It can be seen from the foregoing that it would be desirable to provide external hot plug disk drive support apparatus, of the general type described above, with a variety of operational, fabricational and safety improvements. It is accordingly an object of the present invention to provide hot plug-connected external disk drive support apparatus incorporating such improvements.

SUMMARY OF THE INVENTION

In carrying out principles of the present invention, in accordance with a preferred embodiment thereof, apparatus is provided for removably supporting and providing a hot plug connection for a disk drive such as one of a series of external disk drives used in conjunction with a file server or other computer device. In accordance with various separate aspects of the present invention, the preferred embodiment of the apparatus incorporates therein a variety of operational, fabricational and safety improvements.

The overall disk drive support apparatus representatively comprises a housing structure with a sheet metal cage structure disposed therein and having an open front end, a rear end wall having a hot plug socket thereon, first and second opposite side walls extending between the open front end and the rear end wall, and an opposing pair of wall channel portions formed on front ends of the cage structure side walls.

First and second molded plastic guide channel members having open side portions, and generally U-shaped cross-sections along their lengths are mounted on the facing surfaces of the cage structure side walls in a parallel relationship in which the open side portions of the guide channel members face one another, the lengths of the guide channel members are generally transverse to the front wall channel portions of the cage structure, and the guide channel members are in a generally laterally aligned relationship with the hot plug socket.

The disk drive to be supported within the cage structure is removably secured to the top side of a molded plastic support tray having opposite side edges slidably and supportingly receivable in the interiors of the guide channel members in a manner permitting the support tray to be slid rearwardly along the guide channel members to bring the support tray to an operating position within the cage structure.

A printed circuit board is removably mounted on a rear end portion of the support tray in a manner such that when the support tray is rearwardly moved through the cage structure to its operating position therein the circuit board is conductively and removably received within the hot plug socket. Wiring means are provided for electrically coupling the printed circuit board to the disk drive to transmit power thereto from the hot plug socket.

The use of the molded plastic support tray to carry the disk drive, and the use of a relatively small connector circuit board on the rear end of the tray to connect to the hot plug socket reduces the cost of operatively supporting the disk drive, compared to the conventional practice of using a larger printed circuit board to both carry the disk drive and connect it to the hot plug socket, and further provides more user friendly handling characteristics by eliminating the sharp solder and wiring points typically found along the entire underside of the larger circuit board.

Extending rearwardly along a side surface of the small printed circuit board are pluralities of conductive ground and signal traces. The ground traces extend rearwardly beyond the signal traces. This aspect of the present invention facilitates the electrical performance of the disk drive support structure since when the disk drive is rearwardly moved to its operating position within the cage structure a grounding connection is formed between the circuit board before a signal connection therebetween. Conversely, as the circuit board is unplugged from the hot plug socket, the signal connection is broken before the grounding connection is. To facilitate the mounting of the circuit board on the rear end of the support tray, means are formed on the tray for providing a releasable snap-fit attachment engagement with the circuit board.

Projecting upwardly from the front end of the support tray body is a transverse end plate upon which a plurality of disk drive indicating lights are operatively mounted, the wiring means from the circuit board being conveniently routed to the indicating lights via a wire passage formed by wall means on the top side of the support tray body beneath the disk drive.

To assist in inserting and withdrawing the disk drive from the cage structure, ejection latch members are pivotally secured to front corner portions of the support tray and operate in a generally conventional manner, via reactive forces with the front wall channel portions of the cage structure, to exert leveraged insertion and withdrawal forces on tray. According to a feature of the present invention, the latch members are removably secured to the front corner tray portions using a specially designed molded connection structure that eliminates the requirement for attachment screws or rivets and simplifies the fabrication of the overall disk drive support structure.

As a safety feature, the rear end wall of the cage structure has guard wall means projecting forwardly therefrom and operative to block manual access to the printed circuit board when it is adjacent the hot plug socket. For electrostatic discharge purposes, the guide channel members, which are preferably plastic moldings, have snap-fitted thereon sheet metal grounding clips that are deformingly pressed against the metal cage side walls. Grounding screws secured to and projecting outwardly beyond the disk drive are brought into contact with the clips when the tray is rearwardly moved to its operating position within the cage structure, thereby reliably grounding the inserted disk drive to the metal cage structure.

Inward projections formed on the cage structure side walls are positioned to block these grounding screws, in the event that an attempt is made to rearwardly insert the tray in an upside-down orientation, in a manner preventing the tray from being fully inserted in this improper orientation.

While the various aspects of the present invention summarized above have been described in conjunction with the removable support and hot plug connection of a single disc drive, it will be readily appreciated that by simply using additional hot plug sockets and support components, such as additional guide channel members, support trays and rear end circuit boards, grounding clips, etc., a spaced array of disk drives may be removably supported and hot plug-connected within a housing cage structure.

BRIEF DESCRIPTION OF THE DRAWINGS

FIG. 4 is an exploded perspective view of a rear end portion of the support tray structure illustrating the snap-fit installation thereon of a printed circuit board connector member;

FIG. 5 is an exploded outer side perspective view of a specially designed support rail structure used to slidably carry the disk drives within the cage;

FIG. 6 is an exploded perspective view of the support rail structure and a side wall portion of the cage, and illustrates the snap-fit connection between the support rail structure and the cage wall;

FIG. 7 is a schematic cross-sectional view through one of the support tray structures illustrating the operation of a grounding clip portion of one of its associated support rail structures;

DETAILED DESCRIPTION

Figure 1:
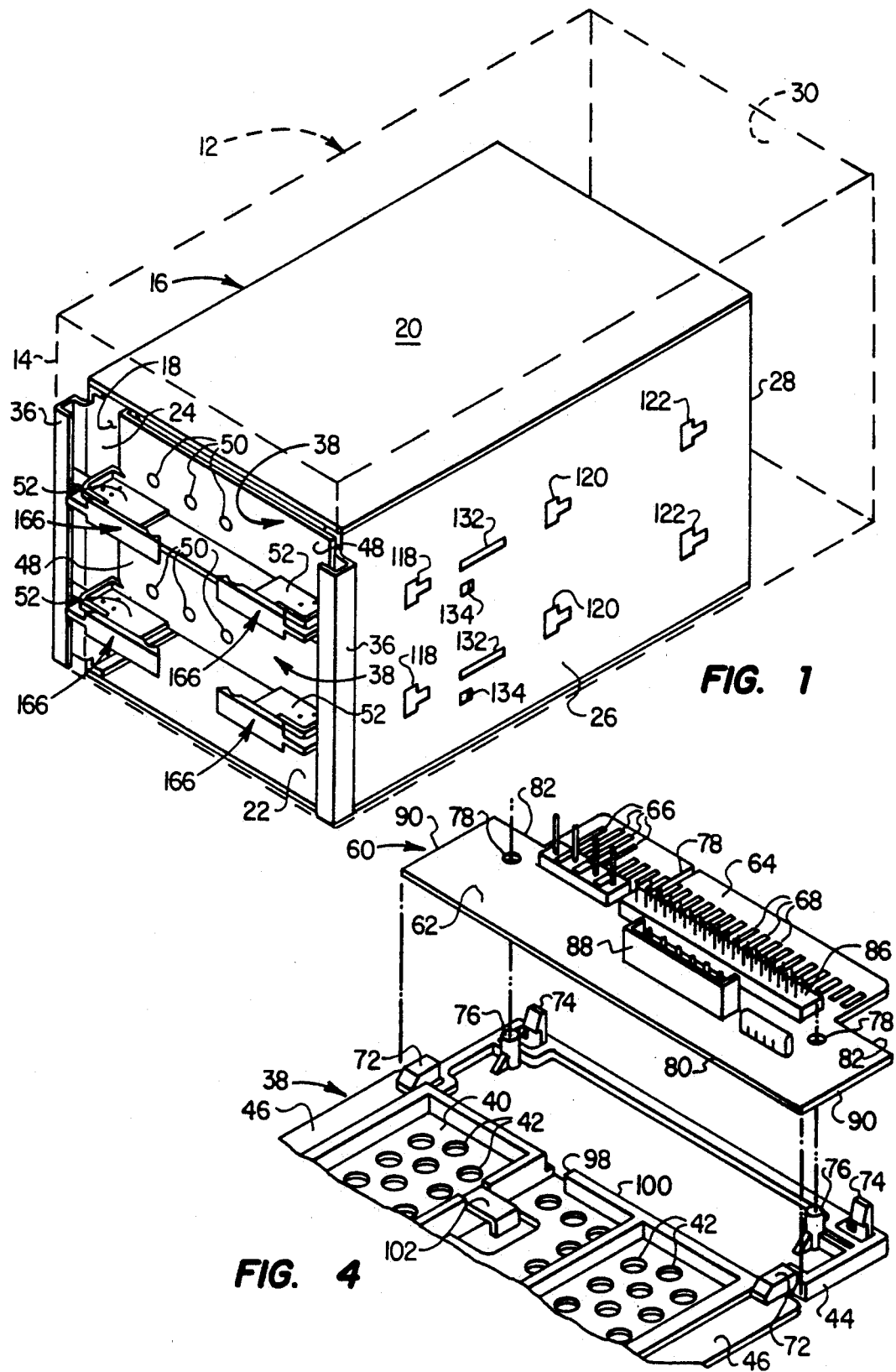
FIG. 1 is a partially phantomed, simplified perspective view of a representative external, hot-plug connection hard disk drive support housing structure embodying principles of the present invention.
Figure 2:
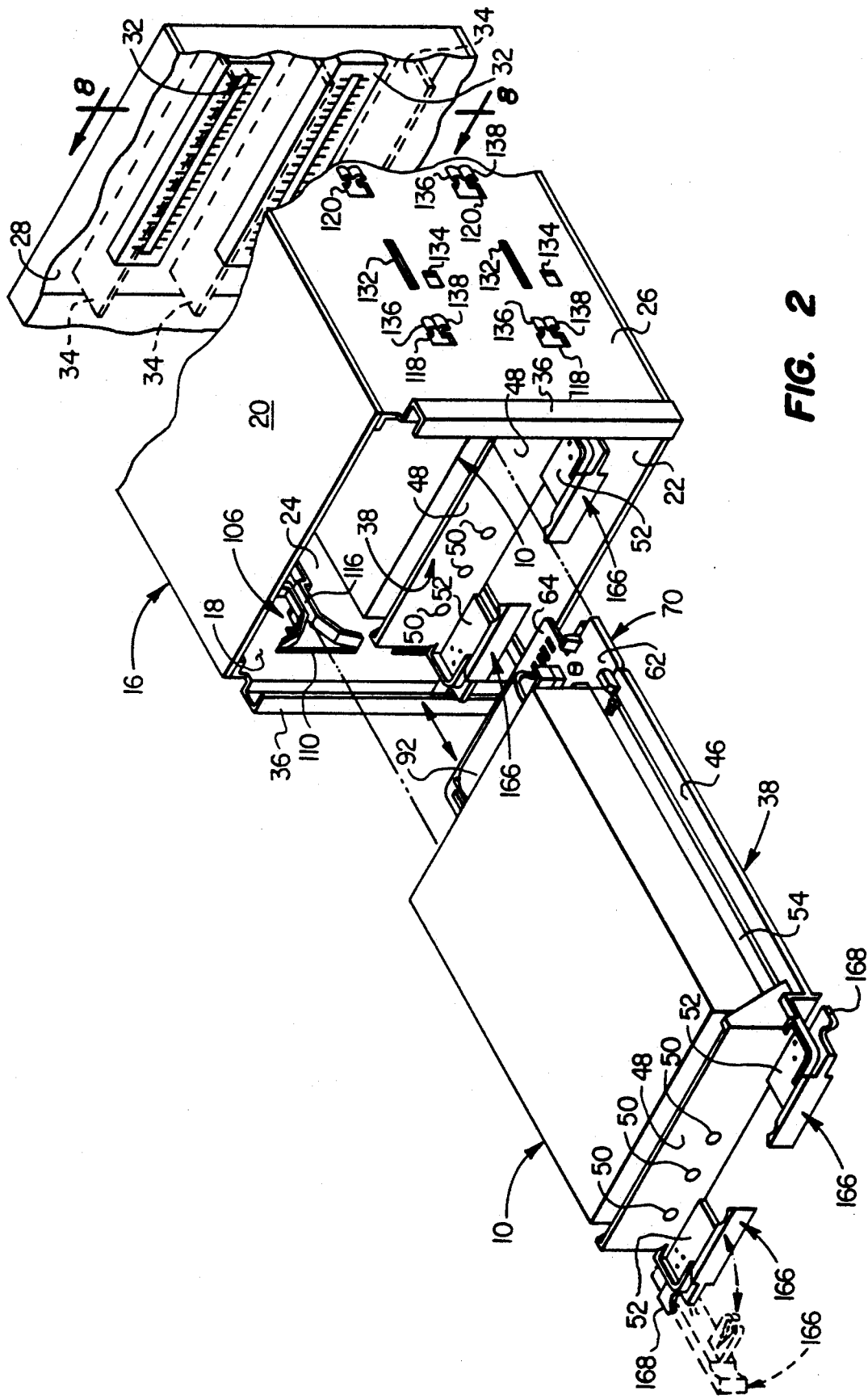
FIG. 2 is an enlarged scale, partially exploded fragmentary perspective view of an interior sheet metal cage portion of the housing, with one of the tray-supported disk drives removed therefrom.

Referring initially to FIGS. 1 and 2 of the drawings, in a preferred embodiment thereof the present invention provides apparatus for removably supporting and providing hot plug connections for a vertically spaced plurality of disk drives 10 (FIG. 2) such as those externally utilized in conjunction with a file server (not shown) or other computer device. The support apparatus representatively includes a generally rectangular housing 12 having an open front end 14, and a generally rectangular sheet metal cage structure 16 disposed within the housing.

Cage 16 has an open front end 18 rearwardly adjacent the housing end 14, top and bottom walls 20 and 22, left and right side walls 24 and 26, and a rear end wall 28 spaced inwardly apart from the rear end wall 30 of housing 12. A vertically spaced pair of horizontally elongated hot plug sockets 32 are mounted on the rear cage end wall 28 (FIG. 2).

For purposes later described, three vertically spaced, horizontally elongated rectangular guard plate members 34 project forwardly beyond the rear cage end wall 28, with each of the sockets 32 being disposed between and parallel to a vertically adjacent pair of the plates 34. Front end portions of the cage side walls 24,26 are bent to form a pair of vertically extending wall channel portions 36 having generally U-shaped cross-sections along their lengths, and horizontally facing open sides.

Referring now to FIGS. 1-4, each of the disk drives 10 is supported on the top side of one of a specially designed pair of molded plastic support trays 38 each having a generally rectangular body 40. Body 40 has a series of cooling holes 42 formed therethrough; a rear end portion 44 (see FIG. 4); a pair of outwardly projecting opposite side edges 46 rearwardly terminating at rear end portion 44; an upwardly projecting front end plate portion 48 with three LED disk drive activity indicating lights 50 mounted thereon; and a pair of opposite front corner portions 52 projecting outwardly beyond the lower side edge of the front end plate 48.

Each disk drive 10 is of a conventional construction and has a pair of mounting rail sections 54 extending forwardly and rearwardly along opposite lower side portions thereof. For purposed later described, metal grounding screws 56 are connected to and project outwardly from the mounting rails adjacent their rear ends. When each disk drive 10 is operatively mounted atop the body portion 40 of its associated support tray 38, the disk drive is positioned between the plate 48 and the rear end portion 44 of the tray body. Each disk drive 10 is removably secured to its associated support tray 38 by screws 58 extending upwardly through the tray body and threaded into the bottom side of the disk drive.

Mounted atop the rear end portion 44 of each support tray 38 is a small printed circuit board 60 having an elongated rectangular body portion 62 from which a somewhat shorter rectangular plug portion 64 centrally projects in a rearward direction. Plug portion 64 has formed on its top side a series of forwardly and rearwardly extending electrically conductive surface traces including grounding traces 66 and signal traces 68. For purposes later described, the grounding traces 66 extend rearwardly beyond the signal traces 68. A slot 78, parallel to the traces 66 and 68, is formed in the circuit board plug portion 64 and functions in a conventional manner to assure the proper orientation of the plug portion when it is operatively inserted into one of the hot plug sockets 32 as later described.

With reference now to FIG. 4, each circuit board body portion 62 is releasably snap-fitted onto the top of its associated rear support tray end portion 44 by means of a pair of abutment tabs 72 formed on opposite sides of the tray body 40; a pair of upwardly projecting latch portions 74 formed on the rear end of the tray; a pair of upwardly projecting cylindrical post portions 76 formed on the rear tray end portion 44 between the facing abutment and latch pairs 72,74; and a pair of circular holes 78 formed through the circuit board body 62.

Figure 3:
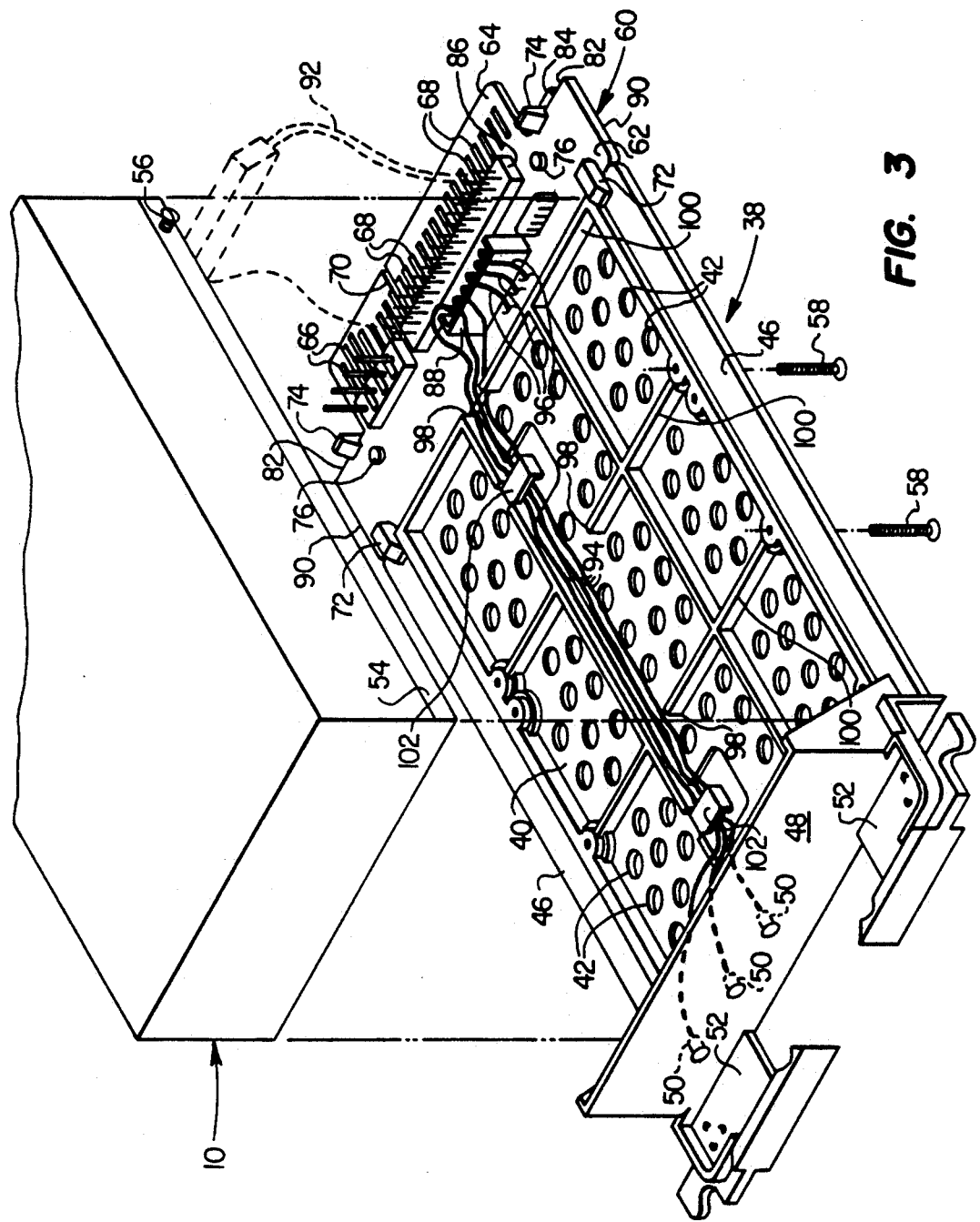
FIG. 3 is an enlarged scale partially exploded perspective view of the removed FIG. 2 disk drive and its underlying support tray structure.

As may be seen by comparing FIGS. 3 and 4, the circuit board 60 is removably installed on the rear support tray end portion 44 by inserting a front side edge portion 80 of the circuit board body under the abutment tabs 72 and then downwardly pivoting the circuit board 60 to cause the posts 76 to upwardly enter the circuit board body holes 78. As the circuit board is pivoted downwardly to its operative position on the support tray, rear side edge portions 82 of the circuit board body rearwardly deflect the latch portions 74 until hooked upper end portions thereof forwardly snap over top side portions of the circuit board body (see FIG. 3) to releasably lock the circuit board on the rear end portion of the support tray 38.

With the circuit board 70 releasably mounted on the support tray 38 in this manner, the posts 76 preclude edgewise movement of the circuit board relative to the support tray so that the posts 76 resist in shear the insertion and removal loads imposed on the circuit board as its plug portion 64 is pushed into and pulled out of its associated hot plug socket 32 as later described. To protect the latch portions 74 against excessive rearward bending, due to installation forces or other forces exerted thereon, a protective abutment wall section 84 is formed on the rear tray end portion 44 a short distance behind and around the outer side of each latch portion 74. These abutment walls 84 act as stops to limit the rearward deflection of each latch portion 74, and as guards to protect the latch portions from damage.

As best illustrated in FIG. 3, with the circuit board 70 mounted on the support tray 38, opposite end edge portions 90 of the circuit board body 62 define rearward continuations of the side edge portions 46 of the support tray 38. To provide for operative wiring interconnections between the circuit board 70, the disk drive 10, and the indicating lights 50, various connector pin sections, such as the illustrated pin sections 86 and 88, are mounted on the circuit board body 62.

Pin section 86 is operatively connected to the rear end of the mounted disk drive 10 by a conventional ribbon cable 92, pin section 88 is operatively connected to the indicating lights 50 by wires 94 (see FIG. 3), and pin section 88 is operatively connected to the underside of the disk drive 10 by wires 96. The wires 94,96 are conveniently routed to the indicating lights 50 and the underside of the disk drive 10 through a wire passage disposed on the top side of the support tray body 40 and generally defined by notches 98 formed in transverse stiffening rib portions 100 of the support tray body, and holding tab portions 102 that overlie the routed wiring.

Referring now to FIGS. 2, 5 and 6, the support trays 38 are slidably and removably mounted within the cage structure 16 by means of four molded plastic guide channel members 106, one of which is visible in FIG. 2 and perspectively illustrated in FIGS. 5 and 6. Each guide channel member 106 has an elongated configuration; a rear end 108; a transversely enlarged front end 110; an outer side 112; an inner side 114; and a generally U-shaped cross-section along its length. The cross-sectional configuration of each guide channel member defines therein a longitudinally extending channel or track 116 that laterally opens through the inner side 114 of the member and vertically widens at the front end of the member to facilitate the slidable insertion therein of a circuit board end edge portion as later described.

The four guide channel members 106 are arranged in an upper pair removably secured in a parallel, laterally opposing relationship to the inner sides of the cage side walls 24 and 26, and a lower pair removably secured in a parallel, laterally opposing relationship to the inner sides of the cage side walls 24 and 26. Guide channel members 106 are releasably snap-fitted onto the cage side walls 24,26 using upper and lower horizontal rows of generally T-shaped openings 118,120,122 formed in each of the cage side walls 24 and 26 (see FIGS. 1, 2 and 6).

As best illustrated in FIG. 6, each of the side wall openings 118,120,122 has a vertically enlarged front end portion 124, and a rear end portion 126 that is vertically narrowed by upper and lower portions 128,130 or the particular cage side wall. For purposes later described, horizontally elongated rectangular openings 132 are formed in the cage side walls 24,26 between each pair of openings 118 and 120, and inturned side wall tab portions 134 are positioned beneath the front ends of the openings 132.

Formed on the outer side of each of the guide channel members 106, and projecting outwardly therefrom, are three longitudinally spaced pairs of upwardly and downwardly extending holding tabs 136 and 138. Between the front two sets of tabs 136,138 the guide channel member has formed thereon a horizontally elongated, inwardly deflectable resilient latch portion 140 laterally projecting outwardly beyond the outer side surface 112 of the guide channel member and having a front end surface 142.

Between its rear two pairs of tabs 136,138 each guide channel member 106 has two longitudinally spaced pairs 144,146 of ribbed outward projections formed on its top and bottom side edge surfaces. These projections have removably snap-fitted thereon clip member pairs 148,150 projecting inwardly from the outwardly bowed body portion 152 of a resiliently deformable sheet metal grounding clip member 154 positioned on the outer side of the guide channel member as illustrated in FIGS. 5 and 6. Projecting inwardly from the top and bottom side edges of the grounding clip member 154, and respectively overlying the top and bottom side edges of the guide channel member 106, are top and bottom side portions 156 and 158. As illustrated, side portion 156 has upturned front and rear ends, and side portion 158 has downturned front and rear ends.

As representatively illustrated in FIG. 6, each guide channel member 106 is removably snap-fitted onto its associated cage side wall (for example, the illustrated left cage side wall 24) by first outwardly inserting the three tab pairs 136,138 into the enlarged front portions 124 of the side wall openings 118,120,122 as indicated by the dashed arrows in FIG. 6, and pressing the guide channel member against the interior surface of the cage side wall. This initial insertion and pressing causes the latch portion 140 to be engaged and inwardly depressed by the side wall 24, and also resiliently bends the clip member body portion 152 against the side wall 24.

With the guide channel member 106 pressed against the cage side wall, the guide channel member is then rearwardly slid along the side wall until the latch portion 140 snaps outwardly into the side wall opening 132. This releasably locks the guide channel member in place on the cage side wall, the front end surface 142 of the latch portion 140 rearwardly overlying the front end surface 162 of the side wall opening 132 and preventing forward movement of the guide channel member relative to the cage, and the rear edge portions of the tab pairs 136,138 abutting the rear end surfaces 164 of the side wall opening portions 126 and preventing rearward movement of the guide channel member relative to the cage.

Each guide channel member 106 may be quickly removed from the cage 16 simply by depressing the latch portion 140 from the outside of the cage, forwardly sliding the guide channel member along the inner surface of its associated cage side wall, and then removing the tab pairs 136,138 from the front end portions 124 of the side wall openings 118,120 and 122. The configuration of each guide channel member 106 makes it reversible—i.e., each guide channel member may be operatively installed on either of the cage side walls 24 and 26. For example, the illustrated FIG. 2 guide channel member 106 installed on the left cage side wall 24 can be alternately installed on the right cage side wall 26 simply by removing the guide channel member from the left side wall, rotating the removed guide channel member 180° about its longitudinal axis, and then snapping the guide channel into place on the right cage side wall 26.

With the two horizontally opposed pairs of guide channel members 106 operatively installed on the inner sided of the cage side walls 24,26 as described above, the two tray-mounted disk drives 10 may simply be pushed into place within the cage 16 by inserting opposite end edge portions of the circuit board body portions 62 into the track portions of the upper and lower opposing guide channel pairs and rearwardly sliding the circuit board and tray edge portions along the tracks until the circuit board portions 64 are operatively hot-plugged into their associated sockets 32 at the rear end of the cage. Either of the disk drives 10 may be removed from the cage, without disturbing the operation of the other disk drive, by simply pulling the disk drive rearwardly out of the cage.

Referring now to FIG. 7, as each of the disk drives 10 rearwardly reaches its operating position within the cage 16, the grounding screws 56 projecting outwardly from opposite sides of the disk drive slide under and upwardly engage the upper side portions 156 of the resilient sheet metal grounding clips 154 on the two guide channel members 106 that slidingly support the inserted disk drive. This engagement between the grounding screws 56 and the upper grounding clip side portions 156 forms secure and reliable electrical grounding connections between the disk drive and the metal cage structure via the grounding screws and the grounding clips. It should be noted that if the guide channel member 106 shown in FIG. 7 was installed on cage side wall 26 instead of the illustrated cage wall 24, the clip member side portion 158, and not the side portion 156, would be engaged by one of the grounding screws 56.

In addition to their electrical grounding function, the two metal grounding screws 56 attached to the opposite sides of each of the disk drives 10 provide another useful function in the overall disk drive support apparatus of the present invention—they cooperate with the inturned cage side wall projections 134 (FIG. 6) to prevent the full rearward insertion of either disk drive into the cage in the event that the disk drive is in an improper upside-down orientation. Specifically, if either disk drive is turned upside-down and then inserted into the cage, the two disk drive 56 strike and are rearwardly stopped by an associated opposing pair of the inturned side wall portions 134, thereby preventing further rearward insertion of the improperly oriented disk drive into the cage. In turn, this prevents the disk drive circuit board 70 from improperly engaging its associated hot plug socket 32.

Figure 8:
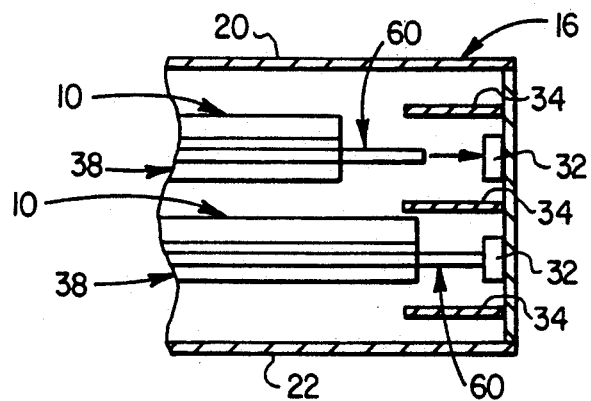
FIG. 8 is a schematic cross-sectional view through a rear end portion of the cage taken along line 8—8 of FIG. 2 and illustrating the operation of a spaced series of forwardly projecting safety guard plates therein.

Referring now to FIG. 8 it can be seen that as each of the disk drives 10 rearwardly reaches its operative position in which its circuit board 60 is fully inserted into its associated hot plug socket 32, a pair of the forwardly projecting guard plates 34 come into play to block both upper and lower manual access to the circuit board as it approaches its associated hot plug socket, the circuit board passing between the two guard plates as it approaches the socket.

Referring now to FIGS. 1, 2 and 9A–9D, the manual pushing and pulling forces on the support trays 38 necessary to respectively insert their circuit board portions into the hot plug sockets, and remove their circuit board portions from the sockets, are desirably lessened by the use of pairs of ejection latch members 166 pivotally secured to the front corner portions 52 of the support trays 38. As representatively illustrated in FIG. 2, each ejection latch member 166 is pivotable relative to its associated tray corner portion 52 between an outwardly pivoted dotted line release position and an inwardly pivoted solid line locking position. The inner ends of the latch members 166 are provided with hook portions 168 that extend into the interiors of the wall channel portions 36 of the cage structure 16.

In a conventional manner, when a given pair of latch members 166 are manually pivoted outwardly from their solid line positions (when their associated disk drive is in its operatively inserted position within the cage) their hook portions 168 bear against the interiors of the channel wall portions 36 in a manner forcibly moving the disk drive rearwardly to unplug its circuit board from its associated hot plug socket. When the latch members 166 are fully pivoted outwardly to their dotted line positions, their hook portions 168 are automatically removed from the wall channel portions 36, thereby permitting the disc drives to be slid rearwardly out of the cage.

Conversely, when one of the disk drives 10 is slid partially into the cage with its latch members 166 in their dotted line positions, to bring the hook portions 168 into alignment with their associated wall channel portions 36, inward pivoting of the latch members 166 from their dotted line positions to their solid line positions causes the hook portions to enter the wall channel portions 36 and then bear against them in a manner forcing the support tray circuit board 60 rearwardly into its associated hot plug socket 32.

Although the general operation of the ejection latch members 166 is conventional, they are pivotally and removably secured to the support tray corner portions 52 in a unique manner that avoids the necessity using of connecting screws or rivets, and which will now be described in conjunction with FIGS. 9A–9D.

Projecting outwardly from the underside of each of the support tray corner portions 52 are a cylindrical boss 170; an inwardly depressible resilient latch portion 172 having an outer end surface 174; and a cylindrical post 176 having a circular outer end portion 178 from which three circumferentially and equally spaced projections 180 radially outwardly extend.

The illustrated ejection latch member 166 has a connection plate portion 182 from which the hook portion 168 outwardly extends. Extending outwardly from the plate portion 182 in the opposite direction is a lever plate section 184. Lever plate section 184 has an inner side surface 186 from which a laterally spaced pair of elongated resilient latch portions 188 outwardly extend, outer end sections of the latch portions 188 having facing arcuate notches 190 formed therein.

A hole 192 is formed transversely through the connection plate portion 182 and is complementarily configured relative to the upper post end 178, the hole having three circumferentially spaced radially outwardly projecting portions through which the upper post end projections 180 may be passed when the upper post end projections 180 and the hole portions 194 are circumferentially aligned.

Figure 9A:
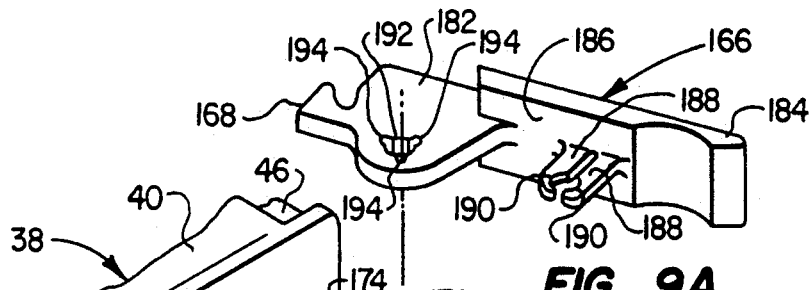
FIGS. 9A-9D are bottom side perspective views of a rear corner portion of one of the disk drive support trays and sequentially illustrate the unique installation and operation thereon of an ejection latch member utilized to facilitate the installation and removal of a disk drive into and from the cage.

Each ejection latch member 166 is pivotally and removably installed on the underside of its associated support tray corner portion 52 in the following manner. Referring first to FIG. 9A, the latch member 166 is oriented as shown so that its connection plate hole 192 is positioned outwardly from the outer post end portion 175 in a manner such that the hole portions 194 are circumferentially aligned with the post end projections 180.

Figure 9B:
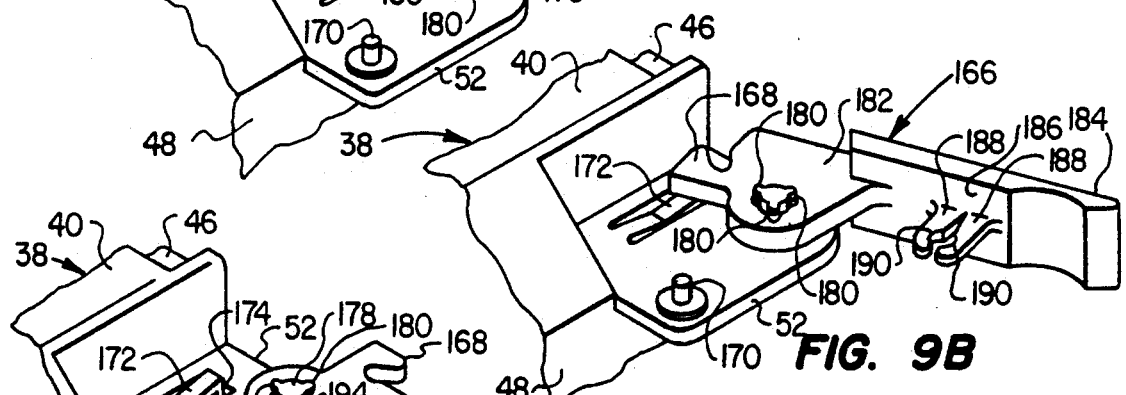

Next, as depicted in FIG. 9B, the latch member connection plate portion 182 is moved inwardly toward and pressed against the underside of the corner portion 52 to cause the post projections 180 to pass through the hole portions 194 and outwardly overlie the connection plate portion 182. With the connection plate portion 182 in its FIG. 9B orientation it contacts and inwardly depresses the corner portion latch 172.

Figure 9D:
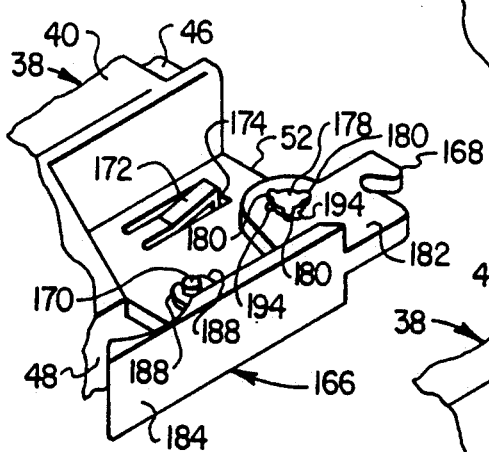
Figure 9C:
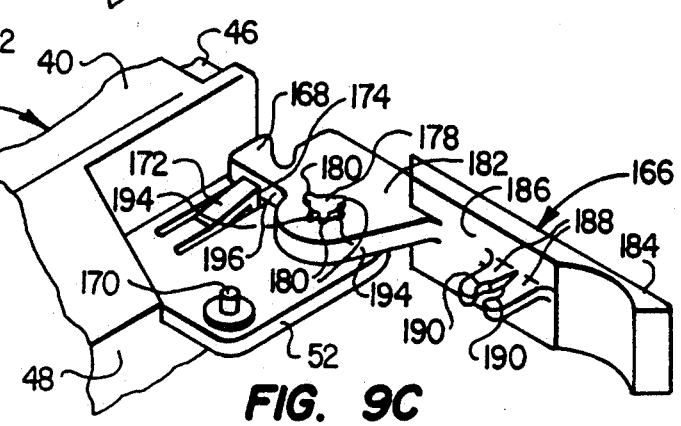

While the connection plate portion 182 is held against the support tray corner portion 52, the latch member 166 is rotated a short distance about post 176 in a clockwise direction to move the plate hole portions 194 out of circumferential alignment with the post projections 180 as shown in FIG. 9C. At this point, in which the latch member 166 is in its dotted line position shown in FIG. 2, the latch portion 172 pops back up so that its end surface 174 faces the plate portion edge surface 196, and the latch member 166 is pivotally and captively retained on the support tray corner portion 52.

It can be seen that, due to the latch end abutment surface 174, the latch member cannot be pivoted in a counterclockwise direction past its FIG. 9C position, to align the hole portions 194 with the post end portions 180 and permit removal of the connecting plate portion 182 from the post 176, unless the latch portion 172 is manually depressed and the latch 166 pivoted back to its FIG. 9B position.

From its FIG. 9C open position the latch member 166 may be pivoted in a clockwise direction to its FIG. 9D closed position in which the boss 170 is received within and releasably held between the arcuate notches 190 in the latch portions 188. At this point the latch member is still captively retained on the post 176 since the hole portions 194 have not been rotated far enough to be brought into alignment with the post end portions 180.

The latch member may be quickly removed from the post 176 simply by rotating the latch member in a counterclockwise direction to its FIG. 9C position, manually depressing the latch 172 and further rotating the latch member to its FIG. 9B position, and then lifting the connecting plate portion 182 off the post 176.

While the disk drive support apparatus representatively described above provides hot plug connections for the disk drives, it will readily be appreciated by those skilled in this art that it could also be employed using non-hot plug socket connections for the disk drives if desired.

The foregoing detailed description is to be clearly understood as being given by way of illustration and example only, the spirit and scope of the present invention being limited solely by the appended claims.

What is claimed is:

1. Apparatus for supporting and providing a plug connection for a disk drive, comprising:
   a housing cage structure having an open front end, a rear end wall having a plug socket thereon, and first and second opposite side walls extending between said open front end and said rear end wall, said first and second opposite side walls having facing surfaces;

first and second elongated guide channel members having open side portions with interiors, and generally U-shaped cross-sections along their lengths;

means for mounting said guide channel members on the facing surfaces of said first and second side walls in a parallel relationship in which said open side portions of the mounted first and second guide channel members face one another and said first and second guide channel members longitudinally extend toward said plug socket in a generally laterally aligned relationship therewith;

a support tray member having opposite side edge portions slidably and supportingly receivable in the interiors of said first and second guide channel members in a manner permitting said support tray member to be slid rearwardly along said first and second guide channel members to bring said support tray member to an operating position within said cage structure, said support tray member having a rear end portion and a top side portion disposed forwardly of said rear end portion;

a printed circuit board having a connector edge portion;

means for removably mounting said printed circuit board on said rear end portion of said support tray member for movement therewith in a manner such that when said support tray member is rearwardly moved through said cage structure to said operating position the connector edge portion of the mounted printed circuit board is conductively and removably received within said plug socket;

means for removably securing the disk drive to said top side portion of said support tray member for movement therewith; and means for electrically coupling said printed circuit board to the disk drive.

2. The apparatus of claim 1 wherein:

said printed circuit board has formed on said connector edge portion thereof a plurality of conductive, rearwardly extending signal traces electrically connectable to said plug socket in response to operative rearward insertion of said connector edge portion into said plug socket, and a plurality of conductive grounding traces electrically connectable to said plug socket in response to operative rearward insertion of said connector edge portion into said plug socket, said grounding traces extending rearwardly beyond said signal traces, whereby, upon insertion of said connector edge portion into said plug socket a grounding connection is formed therebetween before a signal connection and, upon removal of said connector edge portion from said plug socket, the signal connection therebetween is broken before the grounding connection.

3. The apparatus of claim 1 wherein said means for removably mounting said printed circuit board on said rear end portion of said support tray member include:

upwardly projecting clip means formed on said rear end portion of said printed circuit board and operative to engage said printed circuit board and provide for a releasable snap-on fit thereof on said rear end portion of said support tray member.

4. The apparatus of claim 3 wherein:

said clip means include a spaced plurality of upwardly projecting resilient clip members positioned on a rear edge portion of said support tray member and being rearwardly deflectable to lockingly engage rear edge portions of said printed circuit board, and said support tray member has wall means formed thereon and operative to protectively limit rearward deflection of said resilient clip members.

5. The apparatus of claim 3 wherein said means for removably mounting said printed circuit board on said rear end portion of said support tray member further include:

a spaced plurality of holes extending transversely through said printed circuit board, and a spaced plurality of upwardly projecting post portions disposed on said rear end portion of said support tray member and being receivable in said holes to essentially preclude edgewise movement of said printed circuit board relative to said support tray member.

6. The apparatus of claim 1 wherein:

said support tray member is of a molded plastic construction.

7. The apparatus of claim 1 wherein:

said support tray member has a plate member projecting upwardly from the front end thereof in front of the front end of the mounted disk drive, said plate member has a plurality of disk drive indicating lights operatively mounted thereon, and said apparatus further comprises wiring means, interconnected between said printed circuit board and said indicating lights, for transmitting electrical signals from said printed circuit board to said indicating lights.

8. The apparatus of claim 7 further comprising:

wall means associated with said support tray member for forming thereon a wire passage, beneath the mounted disk drive, through which said wiring means extend.

9. The apparatus of claim 1 wherein:

said housing cage structure has opposing channel portions formed on said open front end thereof and extending transversely to said guide channel members, said support tray member has opposite front corner portions, and said apparatus further comprises a pair of ejection latch members pivotally mountable on said opposite front corner portions and operative, when pivoted relative thereto, to engage said cage channel portions in a manner selectively creating an insertion or withdrawal force on said support tray member, and means for removably and pivotally mounting said ejection latch members on said opposite front corner portions of said support tray members.

10. The apparatus of claim 9 wherein, for each of said ejection latch members, said means for removably and pivotally mounting said ejection latch members include:

a hole formed through the ejection latch member, a post member formed on one of said front corner portions of said support tray and insertable through said hole, when the latch member is in a first pivotal orientation relative to the post member, to rotatably support the latch member on the post member, first cooperating means on the post member and the latch member for preventing withdrawal of the post member from the latch member hole when the latch member is rotated about the post member away from said first pivotal orientation relative thereto, and second cooperating means on said one of said front corner portions and the latch member for releasably blocking rotation of the latch member to said first pivotal orientation thereof after the latch member is operatively installed on the post member.

11. The apparatus of claim 10 wherein:

said first cooperating means include a circumferentially spaced plurality of radially outwardly extending projections on an outer end portion of the post member, and a complementarily configured circumferentially spaced plurality of radially outwardly extending portions of the latch member hole through which said projections may be extended to outwardly overlie the latch member when it is in said first pivotal orientation relative to the post member, and said second cooperating means include a stop surface on the latch member and a resilient locking portion disposed on said one of said corner portions of said support tray member, the locking portion being depressible to permit rotation of the latch member about the post member to said first pivotal orientation, and releasable to form an abutment for said stop surface to releasably preclude rotation of the latch member to said first pivotal orientation thereof.

12. The apparatus of claim 1 wherein:

said printed circuit board has opposite side edge portions slidably receivable in said guide channel members and defining rearward extensions of said opposite side edge portions of said support tray member.

13. The apparatus of claim 1 wherein:

said rear end wall of said housing cage structure has guard wall means projecting forwardly therefrom and operative to block manual access to said printed circuit board when it is adjacent said plug socket.

14. The apparatus of claim 13 wherein:

said plug socket is horizontally elongated, and said guard wall means include first and second guard plates projecting forwardly beyond said rear end wall of said housing cage structure above and below said plug socket.

15. The apparatus of claim 1 wherein:

said housing cage structure is formed from a metal material, said first and second guide channel members are formed from a plastic material, and said apparatus further comprises sheet metal grounding clip members carried by said guide channel members and deformingly pressed against said first and second side walls of said housing cage structure, and metal grounding members secured to and projecting outwardly beyond opposite side portions of the mounted disk drive, said metal grounding members being configured and positioned to releasably engage said grounding clip members when said support member is rearwardly brought to said operating position thereof within said housing cage structure.

16. The apparatus of claim 15 further comprising:

cooperating means on said grounding clip members and said guide channel members for providing a releasable snap-fit mounting connection between said grounding clip members and their associated guide channel members.

17. The apparatus of claim 1 further comprising:

cooperating means on said guide channel members and said side walls of said housing cage structure for providing a releasable snap-fit attachment engagement between said guide channel members and said side walls of said housing cage structure.

18. The apparatus of claim 1 further comprising:

cooperating means disposed on the disk drive and said side walls of said housing cage structure for preventing upside-down insertion of said support tray member fully into said housing cage structure.

19. The apparatus of claim 18 wherein said cooperating means include:

an inward projection formed on one of said side walls of said housing cage structure, and a stop member secured to and projecting outwardly from a side portion of the disk drive, said inward projection being positioned to be engaged by said stop member, when said support tray member is partially inserted rearwardly into said guide channel members in an upside-down orientation, in a manner precluding further rearward insertion into said housing cage structure.

20. Apparatus for removably supporting a disk drive, comprising:

a housing cage structure having an open front end, a rear end wall having a plug socket thereon, and first and second opposite side walls extending between said open front end and said rear end wall, and opposing wall channel portions formed on said open front end, said first and second opposite side walls having facing surfaces;

first and second elongated guide channel members having open side portions, and generally U-shaped cross-sections along their lengths;

means for mounting said guide channel members on the facing surfaces of said first and second side walls in a parallel relationship in which said open side portions of the mounted first and second guide channel members face one another and said first and second guide channel members longitudinally extend toward said plug socket in a generally laterally aligned relationship therewith and generally perpendicular to said opposing wall channel portions of said housing cage structure;

a generally flat support member having opposite front corner portions, and opposite side edge portions slidably and supportingly receivable in the interiors of said first and second guide channel members in a manner permitting said support member to be slid rearwardly along said first and second guide channel members to bring said support member to an operating position within said housing cage structure;

a pair of ejection latch members pivotally mountable on said opposite front corner portions of said support member and operative, when pivoted relative thereto, to engage said wall channel portions of said housing cage structure in a manner selectively creating an insertion or withdrawal force on said support member; and means for removably and pivotally mounting said ejection latch members on said opposite front corner portions of said support member, said means for removably and pivotally mounting, for each ejection latch member, including:

a hole formed through the ejection latch member, a post member formed on one of said front corner portions of said support member and insertable through said hole, when the latch member is in a first pivotal orientation relative to the post member, to rotatably support the latch member on the post member, first cooperating means on the post member and the latch member for preventing withdrawal of the post member from the latch member hole when the latch member is rotated about the post member away from said first pivotal orientation relative thereto, and second cooperating means on said one of said front corner portions of said support member and the latch member for releasably blocking rotation of the latch member to said first pivotal orientation thereof after the latch member is rotatably installed on the post member.

21. The apparatus of claim 20 wherein:

said first cooperating means include a circumferentially spaced plurality of radially outwardly extending projections on an outer end portion of the post member, and a complementarily configured circumferentially spaced plurality of radially outwardly extending portions of the latch member hole through which said projections may be extended to outwardly overlie the latch member when it is in said first pivotal orientation relative to the post member, and said second cooperating means include a stop surface on the latch member and a resilient locking portion disposed on said one of said corner portions of said support member, the locking portion being depressible to permit rotation of the latch member about the post member to said first pivotal orientation, and releasable to form an abutment for said stop surface to releasably preclude rotation of the latch member to said first pivotal orientation thereof.

22. The apparatus of claim 20 wherein said plug socket is a hot plug socket.

* * * * *